United States Patent
Roufoogaran

(10) Patent No.: US 7,554,404 B2
(45) Date of Patent: Jun. 30, 2009

(54) METHOD AND SYSTEM FOR A LOW NOISE AMPLIFIER WITH TOLERANCE TO LARGE INPUTS

(75) Inventor: Razieh Roufoogaran, Venice, CA (US)

(73) Assignee: Broadcom Corporation, Irvine, CA (US)

( * ) Notice: Subject to any disclaimer, the term of this patent is extended or adjusted under 35 U.S.C. 154(b) by 31 days.

(21) Appl. No.: 11/754,472

(22) Filed: May 29, 2007

(65) Prior Publication Data

US 2008/0231366 A1  Sep. 25, 2008

Related U.S. Application Data

(60) Provisional application No. 60/895,698, filed on Mar. 19, 2007.

(51) Int. Cl.
*H03F 3/45* (2006.01)

(52) U.S. Cl. .................... 330/261; 330/253

(58) Field of Classification Search ............ 330/69, 330/253, 254, 261
See application file for complete search history.

(56) References Cited

U.S. PATENT DOCUMENTS

| 6,259,321 B1 * | 7/2001 | Song et al. ............ 330/254 |
| 6,480,064 B1 * | 11/2002 | Cyrusian ............... 330/253 |
| 7,034,606 B2 * | 4/2006 | Caresosa et al. ........ 327/563 |

* cited by examiner

*Primary Examiner*—Henry K Choe
(74) *Attorney, Agent, or Firm*—McAndrews, Held & Malloy, Ltd.

(57) ABSTRACT

Methods and systems for a low noise amplifier with tolerance to large inputs are disclosed. Aspects of one method may include providing an individual current source for each input transistor to a low noise amplifier (LNA), wherein the individual current sources may be isolated from each other when the LNA is turned off. The individual current sources may also form a common current source for the input transistors when the LNA is turned on. Accordingly, the input transistors to the LNA may float when the LNA is turned off, thereby coupling the input signal voltage to the source and drain terminals. The individual current sources may be isolated from each other by a coupling transistor that is turned off. When the LNA is turned on, the coupling transistor may be turned on to couple the individual current sources to each other to form the common current source for the input transistors.

20 Claims, 7 Drawing Sheets

METHOD AND SYSTEM FOR A LOW NOISE AMPLIFIER WITH TOLERANCE TO LARGE INPUTS

CROSS-REFERENCE TO RELATED APPLICATIONS/INCORPORATION BY REFERENCE

This application makes reference to, claims priority to, and claims benefit of U.S. Provisional Application Ser. No. 60/895,698 filed Mar. 19, 2007.

This application also makes reference to U.S patent application Ser. No. 11/754,467 filed on even date herewith.

Each of the above stated applications is hereby incorporated herein by reference in its entirety.

FEDERALLY SPONSORED RESEARCH OR DEVELOPMENT

Not Applicable

MICROFICHE/COPYRIGHT REFERENCE

Not Applicable

FIELD OF THE INVENTION

Certain embodiments of the invention relate to wireless communication. More specifically, certain embodiments of the invention relate to a method and system for a low noise amplifier with tolerance to large inputs.

BACKGROUND OF THE INVENTION

In some conventional systems, a wireless system may broadcast radio frequency (RF) signals and receive RF signals. Generally, RF signals are transmitted at higher power levels than power levels of RF signals received at an antenna. The RF signals to be transmitted may be amplified to a desired power level by a power amplifier before being communicated to a transmit antenna. These transmitted signals will attenuate with distance traveled so that a receive antenna that is farther away will generally receive a weaker signal that a receive antenna that is closer. Typically, the received signals may not be able to be processed without amplifying them.

Accordingly, the received RF signals may be amplified by a low-nose amplifier (LNA) before further processing the signals. For example, the RF signals may be downconverted to a lower frequency and/or demodulated, by the receiver portion of the wireless system. The LNAs may be designed to minimize addition of noise to the received RF signals since the signal-to-noise level may be very low.

However, since the LNAs may be adversely affected by the power levels generated by the power amplifiers, the LNAs and power amplifiers may be placed on separate chips. This may increase the chip count for a system, resulting in additional parts, larger printed circuit board layout real estate, and more complex trace routing.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for a low noise amplifier with tolerance to large inputs, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a low noise amplifier with tolerance to large inputs. Aspects of the method may comprise providing an individual current source for each input transistor to a low noise amplifier (LNA), wherein the individual current sources may be isolated from each other when the LNA is turned off. Isolating the individual current sources may be accomplished, for example, by using a switch. The switch may be, for example, a coupling transistor whose drain and source terminals are directly electrically coupled to a source terminal of one input transistor and a source terminal of the other input transistor, respectively.

The individual current sources may also form a common current source for the input transistors when the LNA is turned on. This may be accomplished by turning on the coupling transistor. Accordingly, when the coupling transistor is turned off, for example, when the LNA is turned off, the individual current sources may be isolated from each other. When the coupling transistor is turned on, for example, when the LNA is turned on, the individual current sources may form a single current source that may be used for both input transistors. Additionally, when the LNA is turned off, various transistors in the LNA, except for the input transistors, may be turned off by deasserting appropriate control signals at the gates of the transistors.

Figure 1:
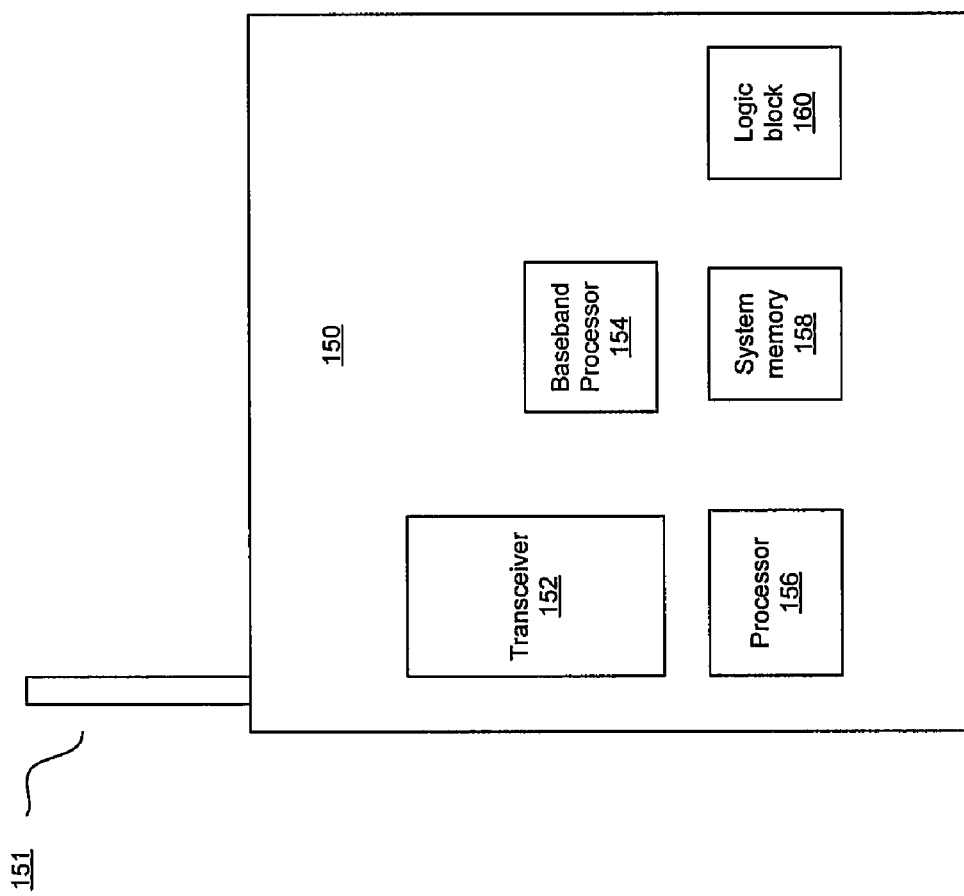
FIG. 1 is a block diagram of an exemplary wireless system, which may be utilized in connection with an embodiment of the invention.

FIG. 1 is a block diagram of an exemplary wireless system, which may be utilized in connection with an embodiment of the invention. Referring to FIG. 1, the wireless system 150 may comprise an antenna 151, a transceiver 152, a baseband processor 154, a processor 156, a system memory 158, and a logic block 160. The antenna 151 may be used for reception and/or transmission of RF signals. The transceiver 152 may comprise suitable logic, circuitry, and/or code that may be adapted to modulate and upconvert baseband signals to RF signals for transmission by one or more antennas, which may be represented generically by the antenna 151.

The transceiver 152 may also be adapted to downconvert and demodulate received RF signals to baseband signals. The RF signals may be received by one or more antennas, which may be represented generically by the antenna 151. Different wireless systems may use different antennas for transmission and reception. The transceiver 152 may be adapted to execute other functions, for example, filtering the baseband and/or RF signals, and/or amplifying the baseband and/or RF signals.

The baseband processor 154 may comprise suitable logic, circuitry, and/or code that may be adapted to process baseband signals for transmission via the transceiver 152 and/or the baseband signals received from the transceiver 152. The processor 156 may be any suitable processor or controller such as a CPU or DSP, or any type of integrated circuit processor. The processor 156 may comprise suitable logic, circuitry, and/or code that may be adapted to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154.

Control and/or data information, which may comprise the programmable parameters, may be transferred from other portions of the wireless system 150, which may not be shown, to the processor 156. Similarly, the processor 156 may be adapted to transfer control and/or data information, which may include the programmable parameters, to other portions of the wireless system 150, which may not be shown, which may be part of the wireless system 150.

The processor 156 may utilize the received control and/or data information, which may comprise the programmable parameters, to determine an operating mode of the transceiver 152. For example, the processor 156 may be utilized to select a specific frequency for a local oscillator or a specific gain for a variable gain amplifier, and/or configure the local oscillator and/or configure the variable gain amplifier for operation in accordance with various embodiments of the invention. Moreover, the specific frequency selected and/or parameters needed to calculate the specific frequency, and/or the specific gain value and/or the parameters that may be utilized to calculate the specific gain, may be stored in the system memory 158 via the processor 156, for example. The information stored in system memory 158 may be transferred to the transceiver 152 from the system memory 158 via the processor 156. The system memory 158 may comprise suitable logic, circuitry, and/or code that may be adapted to store a plurality of control and/or data information, including parameters needed to calculate frequencies and/or gain, and/or the frequency value and/or gain value.

The logic block 160 may comprise suitable logic, circuitry, and/or code that may enable controlling of various functionalities of the wireless system 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

Figure 2:
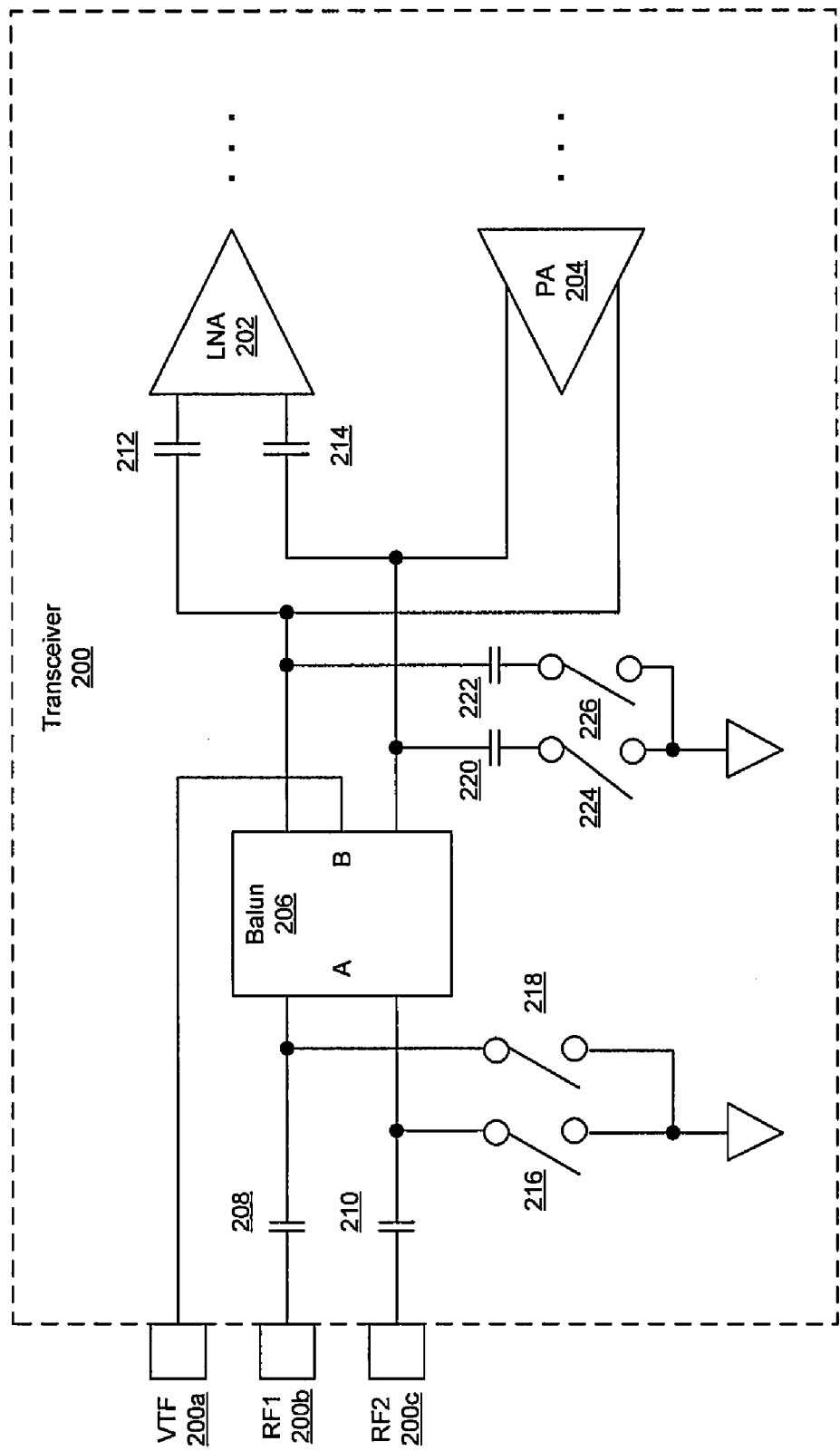
FIG. 2 is a block diagram illustrating an exemplary transceiver on a chip, in accordance with an embodiment of the invention.

FIG. 2 is a block diagram illustrating an exemplary transceiver on a chip, which may be utilized in connection with an embodiment of the invention. Referring to FIG. 2, there is shown a transceiver 200, which may be similar in functionality to the transceiver 152. The transceiver 200 may be, for example, on a single chip. The transceiver 200 may comprise, in part, a low-noise amplifier (LNA) 202, a power amplifier 204, a balun block 206, capacitors 208, 210, 212, 214, 220, and 222, and switches 216, 218, 224, and 226. There is also shown chip I/O pads 200a, 200b, and 200c for input and output of signals.

The LNA 202 may comprise suitable logic and/or circuitry that may enable amplification of RF signals received by, for example, the wireless system 150. The LNA 202 may comprise a single-ended input or differential inputs, and may generate a single-ended output or differential output. The number of inputs and the number of outputs for the LNA 202 may be design and/or implementation dependent. The LNA 202 may be controlled by, for example, the baseband processor 154, the processor 156, and/or the logic block 160.

The power amplifier 204 may comprise suitable logic and/or circuitry that may allow amplification of RF signals for transmission by the wireless system 150. The LNA 202 may comprise a single-ended input or differential inputs, and may generate a single-ended output or differential output. The number of inputs and the number of outputs for the power amplifier 204 may be design and/or implementation dependent. The balun block 206 may comprise suitable circuitry that may enable coupling RF signals from side A to side B of the balun block 206, and vice versa. The balun block 206 may provide, for example, impedance matching between circuitry on side A of the balun block 206 and circuitry on side B of the balun block 206.

The capacitors 208, 210, 212, and 214 may provide AC coupling for signals to and from side A of the balun block 206 and to the LNA 202, respectively. The switches 216 and 218 may be controlled by a processor in the wireless system 150, for example, the processor 156, to allow different transmission and/or reception configurations. The switches 216 and 218 may also be controlled, for example, by the baseband processor 154 and/or the logic block 160. Various exemplary configurations will be described in more detail with respect to FIGS. 3-6B.

The capacitors 220 and 222 may be configured by the switches 224 and 226, respectively, as additional capacitive loads to be used as needed. For example, when the LNA 202 is turned off, the switches 224 and 226 may be closed to provide various compensating capacitive loads for the power amplifier 204. The switches 224 and 226 may be controlled similarly to the switches 216 and 218 by, for example, the processor 156, the baseband processor 154, and/or the logic block 160. In one embodiment of the invention, the switches 216 and 218 may be coupled to, for example, receiver circuitry ground plane used by the LNA 202, and the switches 224 and 226 may be coupled to, for example, power amplifier ground plane used by the power amplifier 204. The invention need not be so limited, however. Accordingly, various embodiments of the invention may use other ground planes.

In operation, a center tap for side B of the balun block 206 may be connected to an appropriate voltage via, for example, the chip I/O pad 200a, for the type of operation desired. The chip I/O pad 200a may be connected to, for example, to a voltage $V_{TF}$ that may be 1.5 volts for low output power gain. For higher output power gain, the voltage $V_{TF}$ may be, for example, 2.5 volts or 3.3 volts. The switches 216 and 218 may be opened or closed depending on the type of operation and whether the transceiver 200 may be operating in a receive mode or a transmit mode.

For example, one type of operation may utilize an off-chip power amplifier (not shown for FIG. 2), and one of the chip I/O pads 200b and 200c may be used to input received RF signals to the transceiver 200 and the other of the chip I/O pads 200b and 200c may be used to output RF signals to be amplified by the off-chip power amplifier. Accordingly, the input and output RF signals at the chip interface may be single-ended via the chip I/O pads 200b and 200c. For another type of operation, the power amplifier 204 may be used to output power of up to, for example, 5 dBm, or substantially close to 5 dBm. The output of the transceiver 200 at the chip interface may also be a single-ended output via the chip I/O pads 200b and 200c. The transceiver 200 may also be configured for differential input/output via the chip I/O pads 200b and 200c.

The received RF signals may be communicated from, for example, an antenna such as the antenna 151. While the antenna 151 may have been described as a single antenna, the invention need not be so limited. For example, the antenna 151 may comprise a plurality of antennas, and there may be separate antennas dedicated to transmission and to reception.

Figure 3:
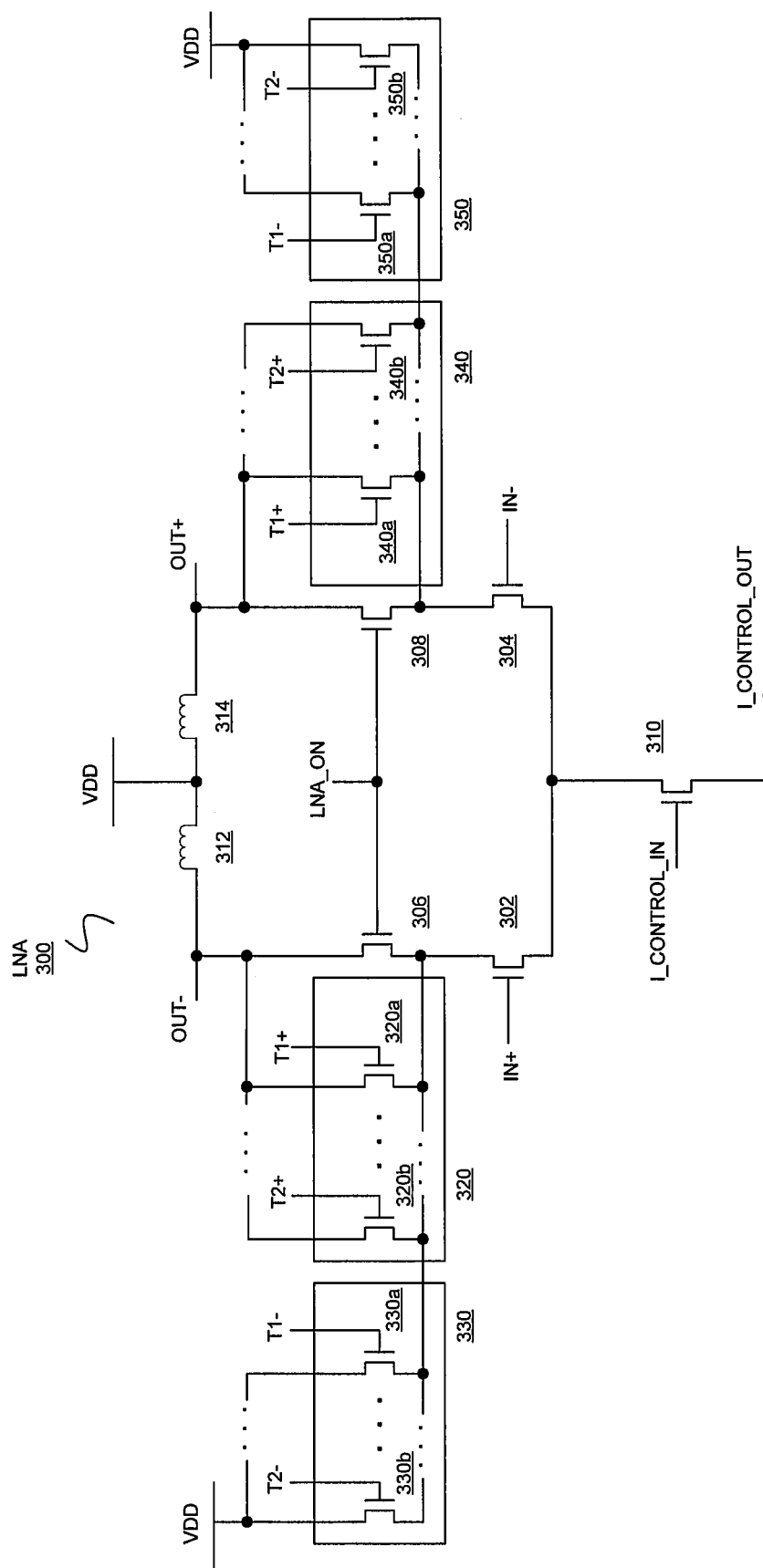
FIG. 3 is a circuit diagram illustrating a low noise amplifier.

FIG. 3 is a circuit diagram illustrating a low noise amplifier. Referring to FIG. 3, there is shown a LNA 300, which may be functionally similar to the LNA 202. The LNA 300 may comprise transistors 302, 304, 306, 308, 310, inductors 312 and 314, and transistor blocks 320, 330, 340, and 350. The transistors 302 and 304 may comprise input transistors for the LNA 300. The transistors 306 and 308 may comprise output transistors for the LNA 300. The transistor 310 may comprise a current source for the LNA 300, where the current through the transistor 310 may be determined by, for example, the biasing voltage I_CONTROL_IN and the source voltage I_CONTROL_OUT. The source voltage I_CONTROL_OUT may be, for example, at a ground potential. The inductors 312 and 314 may, for example, reduce the RF output signals OUT+ and OUT− from coupling to the supply voltage VDD.

The transistor blocks 320, 330, 340, and 350 may each comprise a similar number of transistors that may be turned on and off individually, where a drain terminal of each transistor may be DC coupled to a supply voltage VDD. Each of the plurality of transistors 320a . . . 320b in the transistor blocks 320 and 330, respectively, may be turned on or off via, for example, one of a plurality of control signals T1+ . . . T2+, respectively. For example, when the signal T1+ is asserted, the transistors 320a and 340a may be turned on. Similarly, when the signal T2+ is asserted, the transistors 320b and 340b may be turned on. Accordingly, by asserting specific control signals, specific transistors in the transistor blocks 320 and 340 may be turned on. Controlling the number of transistors that may be turned on may allow control of amplification of the input signals IN+ and IN−.

The transistor blocks 330 and 350 may each comprise a similar number of transistors as the transistor block 320 or 350. Each of the transistors 330a . . . 330b and 350a . . . 350b in the transistor blocks 330 and 350, respectively, may be controlled by control signals T1− . . . T2−. The control signals T1− . . . T2− may be, for example, inverted with respect to the control signals T1+ . . . T2+. For example, if the control signal T1+ is at a high voltage level, the control signal T1− may be at a low voltage level. Similarly, if the control signal T1+ is at a low voltage level, the control signal T1− may be at a high voltage level.

Accordingly, half of the transistors in the transistor blocks 320 and 330 may have their drain terminals effectively shorted to the drain terminal of the input transistor 302. Similarly, half of the transistors in the transistor blocks 340 and 350 may have their drain terminals effectively shorted to the drain terminal of the input transistor 304. Since the drain terminals of the transistors in the transistor blocks 320, 330, 340 and 350 may be DC coupled to the supply voltage VDD, the drain terminals of the transistors 302 and 304 may be at the voltage level of the supply voltage VDD.

In operation, the control signals T1+ . . . T2+ and T1− . . . T2− may be appropriately set for a desired gain by the LNA 300. The control signals T1+ . . . T2+ and T1− . . . T2− may be generated by, for example, the baseband processor 154, the processor 156, and/or the logic block 160. Since the signals T1+ . . . T2+ and T1− . . . T2− may be communicated to the transistor blocks 320 and 330 and to the transistor blocks 340 and 350, the gain may be similar for the differential input signals IN+ and IN−. The control signal LNA_ON may be communicated to the gate terminals of the transistors 306 and 308. The control signal LNA_ON may be asserted, for example, when the transceiver 200 is receiving signals. The control signal LNA_ON may be deasserted, for example, when the transceiver 200 is transmitting signals. When the control signal LNA_ON is asserted, the LNA 300 may be in an operational mode. Accordingly, the differential RF input signals IN+ and IN− received by the input transistors 302 and 304 may be amplified and the differential RF output signals OUT+ and OUT− may be generated.

When the control signal LNA_ON is deasserted, the LNA 300 may not need to operate. However, differential signals, for example, from the power amplifier 204, may still be received as differential RF input signals IN+ and IN− by the transistors 302 and 304. Accordingly, the voltages at the gates of the transistors 302 and 304 may couple to the source terminals of the transistors 302 and 304. Since the source terminals of the transistors 302 and 304 may be shorted together, the AC voltages may cancel. The result may be that when the control signal LNA_ON is deasserted, the source terminals of the transistors may be at a common mode voltage that may not be affected by the voltage swing at the gate terminals of the transistors 302 and 304. Therefore, if the gate-source voltage $V_{GS}$ due to the voltage swing at the gate terminal is greater than a breakdown voltage for the transistors 302 and 304, the transistors 302 and/or 304 may be damaged.

Similarly, since the drain terminals of the transistors 302 and 304 may be effectively shorted to the supply voltage VDD, the drain terminals of the transistors 302 and 304 may be held to the supply voltage VDD. Accordingly, if the gate-drain voltage $V_{GD}$ due to the voltage swing at the gate terminal is greater than a breakdown voltage for the transistors 302 and 304, the transistors 302 and/or 304 may be damaged.

Figure 4:
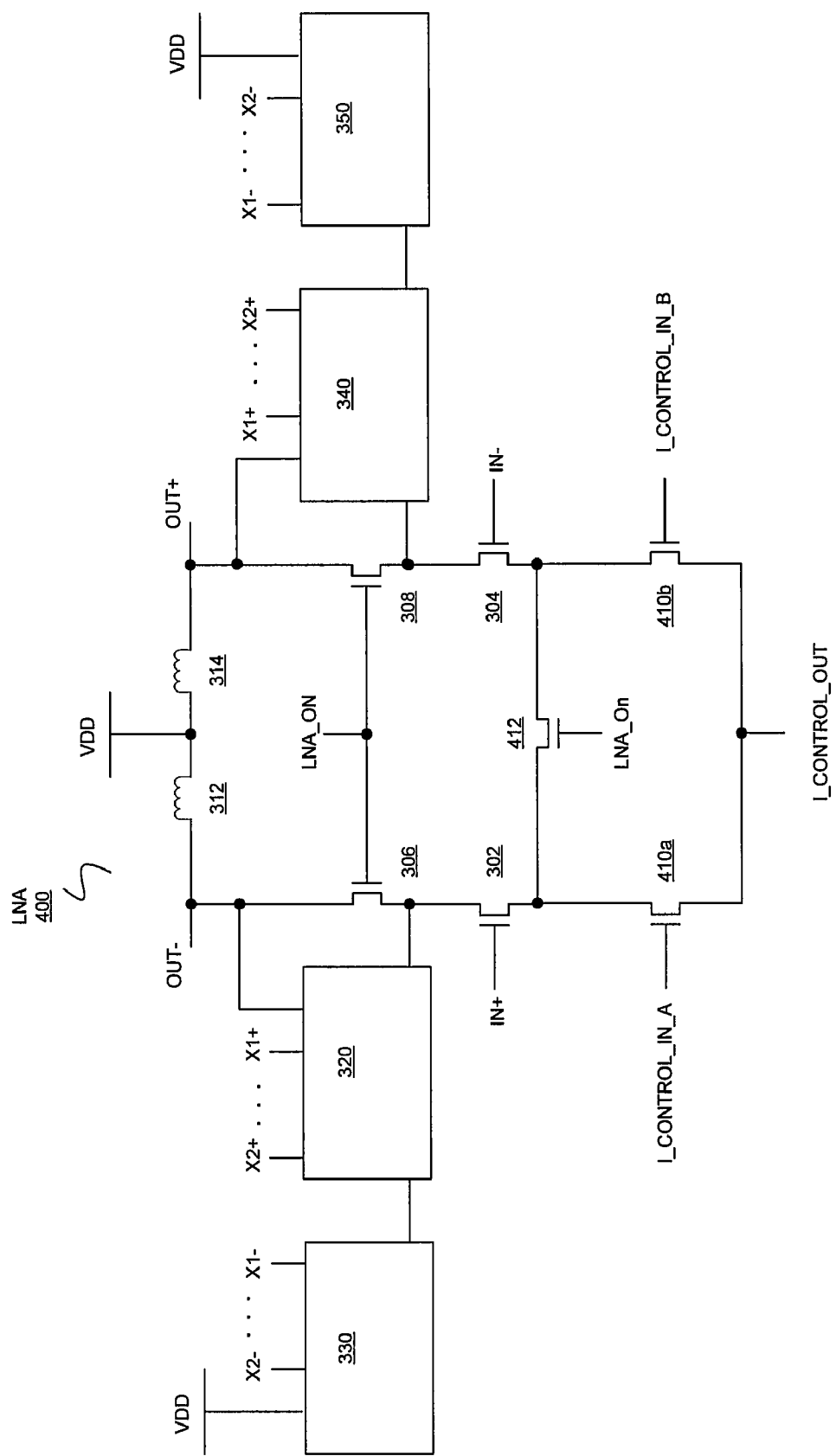
FIG. 4 is a circuit diagram illustrating an exemplary low noise amplifier, in accordance with an embodiment of the invention.

FIG. 4 is a circuit diagram illustrating an exemplary low noise amplifier, in accordance with an embodiment of the invention. Referring to FIG. 4, there is shown a LNA 400 that may comprise transistors 302, 304, 306, 308, 410a, 410b, and 412. The LNA 400 may also comprise inductors 312 and 314, and transistor blocks 320, 330, 340, and 350. The transistors 302, 304, 306 and 308, the inductors 312 and 314, and the transistor blocks 320, 330, 340, and 350 may be used substantially as described with respect to FIG. 3.

However, the transistors in the transistor blocks 320, 330, 340, and 350 may be controlled by the control signals X1+ . . . X2+, and X1− . . . X2−. The transistors 410a and 410b may be, for example, individual current sources that may operate substantially as a single current source when the LNA 400 is in turned on. The LNA 400 may be turned on, for example, when the control signal LNA_ON is asserted. The transistor 410a and the transistor 410b may be biased via biasing voltages I_CONTROL_IN_A and I_CONTROL_IN_A. The source voltage I_CONTROL_OUT may be, for example, a ground directly coupled to the source terminals of the transistors 410a and 410b.

In operation, the control signals X1+ . . . X2+ and X1− . . . X2− may be appropriately set for a desired gain for the LNA 400. Since the control signals X1+ . . . X2+ and X1− . . . X2− may be communicated to the transistor blocks 320 and 330 and to the transistor blocks 340 and 350, the gain may be similar for the differential input signals IN+ and IN−. The control signals X1+ . . . X2+ and X1− . . . X2 may be similar to the control signals T1+ . . . T2+ and T1− . . . T2−, however, the control signals X1+ . . . X2+ and X1− . . . X2 may be, for example, logically ANDed with the control signal LNA_ON. Accordingly, when the control signal LNA_ON is asserted, the control signals X1+ . . . X2+ and X1− . . . X2 may be in a same state as the control signals T1+ . . . T2+ and T1− . . . T2−.

However, when the control signal LNA_ON is deasserted, the control signals X1+ . . . X2+ and X1− . . . X2 may be deasserted regardless of the state of the control signals T1+ . . . T2+ and T1− . . . T2−. Accordingly, the transistors in the transistor blocks 320, 330, 340, and 350 may be turned off when the LNA 400 is disabled. Generation of the signals X1+ . . . X2+ and X1− . . . X2 is illustrated with respect to FIG. 5. The control signal LNA_ON may be deasserted, for example, when the transceiver 200 operates in a transmit mode, and the control signal LNA_ON may be asserted, for example, when the transceiver 200 is in a receive mode.

The control signal LNA_ON may be communicated to the gate terminals of the transistors 306 and 308. Accordingly, the inputs IN+ and IN− received via the input transistors 302 and 304, respectively, may be amplified appropriately via the transistor 306 and the transistor blocks 320 and 330 and the transistor 304 and the transistor blocks 340 and 350, respectively. Exemplary biasing for the input transistors 302 and 304 is illustrated with respect to FIG. 6A.

The control signal LNA_ON may also be communicated to the transistor 412. When the control signal LNA_ON is asserted, the transistor 412 may be turned on. Accordingly, the source terminals of the transistors 302 and 304 may be effectively shorted together. The transistors 410a and 410b may then act as a single current source for the transistors 302 and 304. Accordingly, the differential RF input signals IN+ and IN− received by the input transistors 302 and 304 may be amplified and the differential RF output signals OUT+ and OUT− may be generated.

When the control signal LNA_ON is deasserted, the transistor 412 may be turned off. Accordingly, the transistor 410a may act as a current source for the transistor 302 and the transistor 410b may act as a current source for the transistor 304. In this manner, the input signals IN+ and IN− at the gates of the transistors 302 and 304, for example, from the power amplifier 204, may be coupled to both the drain and source terminals of the transistors 302 and 304, respectively. Accordingly, the transistors 302 and 304 may float with input signals since the transistors 302 and 304 may be isolated from each other. The input voltage at the gate of the transistor 302 may therefore couple to the drain and source terminals of the transistor 302. Similarly, the input voltage at the gate of the transistor 304 may therefore couple to the drain and source terminals of the transistor 304. Accordingly, gate-source and gate-drain voltages for the transistors 302 and 304 may not rise to breakdown voltage levels where damage may occur in the transistors 302 and/or 304. The current source circuitry related to the transistors 410a and 410b is described in more detail with respect to FIG. 6B.

Figure 5:
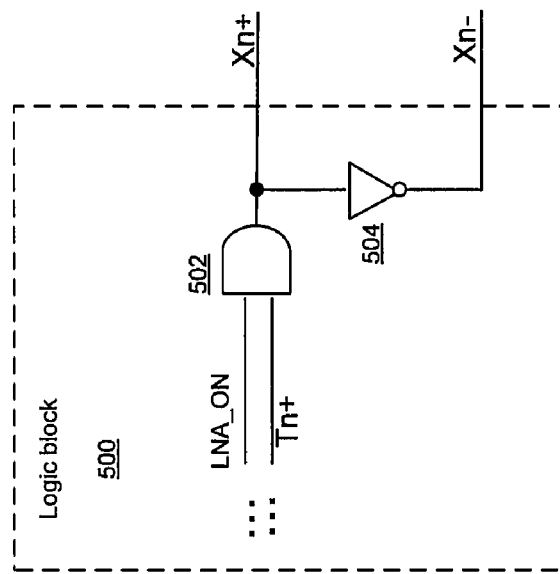
FIG. 5 is a circuit diagram illustrating an exemplary circuit for generating transistor control signals, in accordance with an embodiment of the invention.

FIG. 5 is a circuit diagram illustrating an exemplary circuit for generating transistor control signals, in accordance with an embodiment of the invention. Referring to FIG. 5, there is shown an AND gate 502 and an inverter 504. The AND gate 502 may have as an input the control signals LNA_ON and Tn+, where Tn+ may be one of the control signals T1+ . . . T2+. The output of the AND gate 502 may be Xn+, where Xn+ may correspond to one of the control signals T1+ . . . T2+. Accordingly, when the controls signal LNA_ON is asserted, for example, when the transceiver 200 is in a receive mode, the output control signal Xn+ may be the same state as the input control signal Tn+. The control signal Xn+ may be inverted by the inverter 504 to generate the control signal Xn−. Therefore, the transistors in the transistor block 320, 330, 340, and 350 may be turned on or off by the control signals Xn+ and Xn− for appropriate gain control. The control signals Xn+ and Xn− may be generated by, for example, the baseband processor 154 and/or the logic block 160.

However, when the control signal LNA_ON is deasserted, for example, when the transceiver 200 is in a transmit mode, the control signal Xn+ may be deasserted regardless of the state of the input control signal Tn+. Accordingly, the control signal Xn− may also remain deasserted while the control signal LNA_ON is deasserted. Accordingly, the transistors in the transistor blocks 320, 330, 340, and 350 may be turned off while the control signal LNA_ON is deasserted.

Figure 6A:
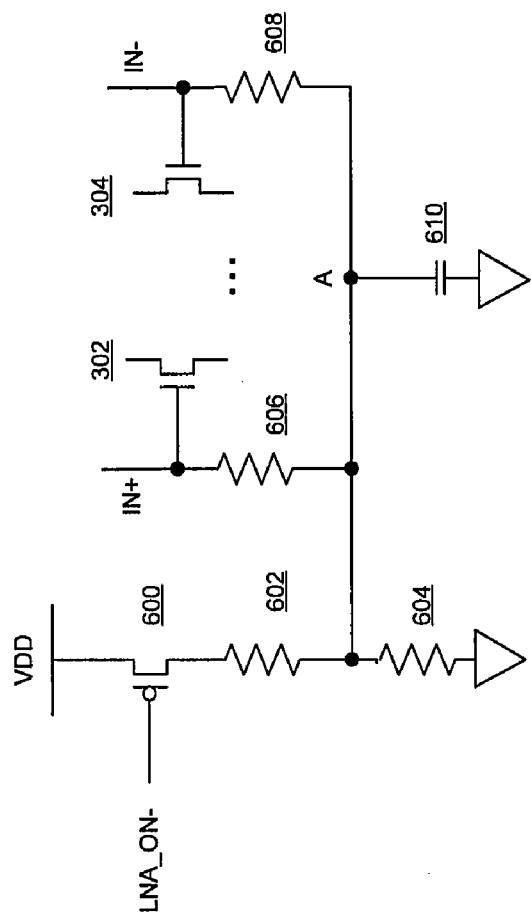
FIG. 6A is a circuit diagram illustrating an exemplary input transistor biasing, in accordance with an embodiment of the invention.

FIG. 6A is a circuit diagram illustrating an exemplary input transistor biasing, in accordance with an embodiment of the invention. Referring to FIG. 6A, there is shown the input transistors 302 and 304, a biasing transistor 600, and biasing resistors 602 and 604. There is also shown filtering resistors 606 and 608, and a filtering capacitor 610. The filtering resistors 606 and 608 may be coupled to the filtering capacitor 610 such that node A may effectively be an AC ground.

The biasing transistor 600 may be turned on when the control signal LNA_ON− is asserted. Accordingly, the biasing resistors 602 and 604 may be used to set a DC offset voltage at node A. Since the gates of the transistors 302 and 304, which may be MOS transistors, may have a very high input impedance, the DC offset voltage at node A may be a DC offset voltage for the input signals IN+ and IN− at the gates of the transistors 302 and 304. When the control signal LNA_ON− is deasserted, the biasing transistor 600 may be turned off. Accordingly, the gates of the transistors 302 and 304 may effectively at ground, thereby turning off the transistors 302 and 304.

Figure 6B:
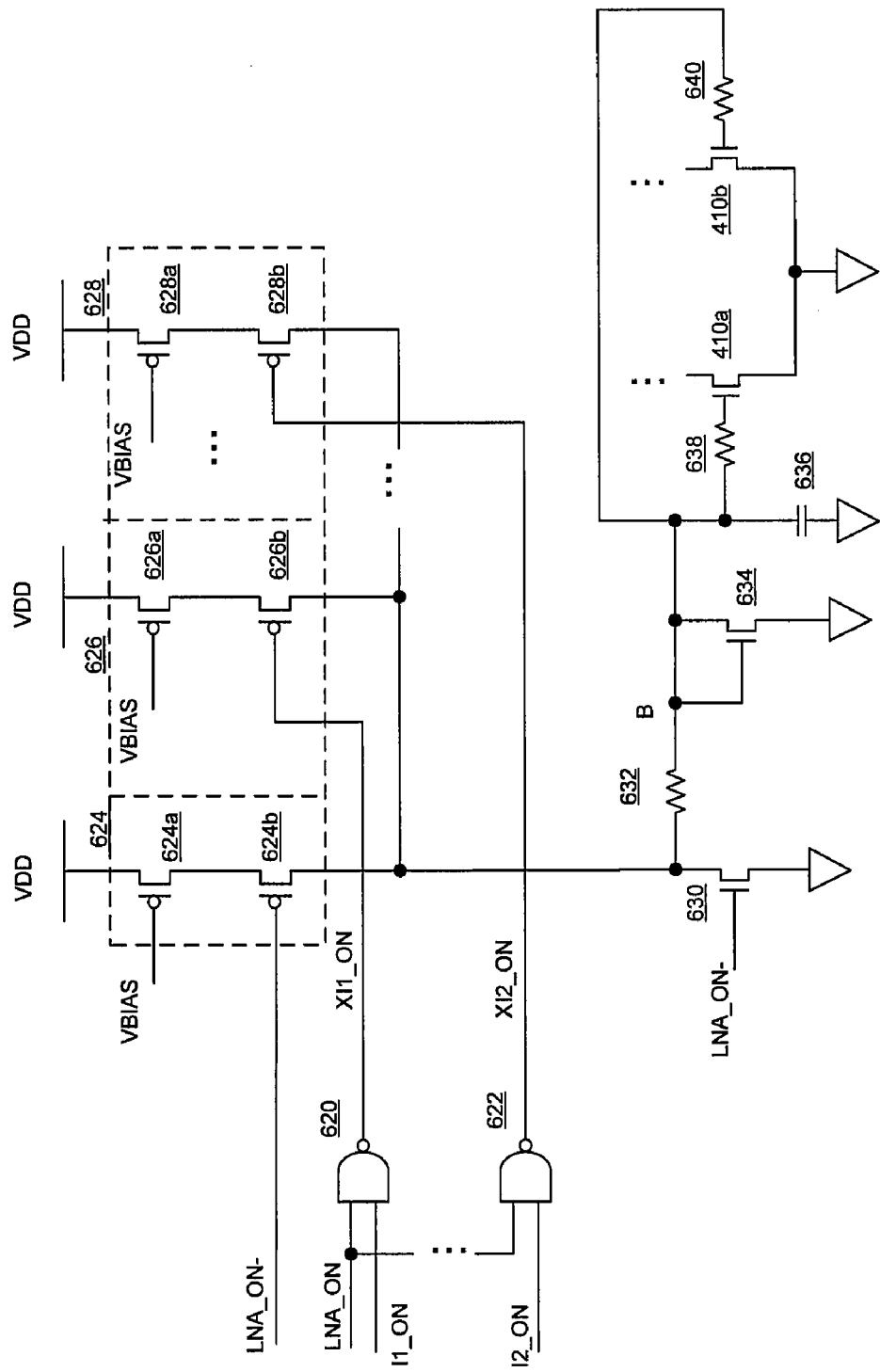
FIG. 6B is a circuit diagram illustrating an exemplary current source circuit, in accordance with an embodiment of the invention.

FIG. 6B is a circuit diagram illustrating an exemplary current source circuit, in accordance with an embodiment of the invention. Referring to FIG. 6B, there is shown NAND gates 620 and 622, PMOS current sources 624, 626 . . . 628, NMOS transistors 630 and 634, resistors 632, 638, and a capacitor 636. There is also shown the transistors 410a and 410b, which may be current sources for the input transistors 302 and 304.

In operation, the control signals LNA_ON and LNA_ON− may be asserted, for example, when the transceiver 200 may be operating in a receive mode. Since the transistor 630 may be turned on when the transceiver 200 may not be in a receive mode, the transistor 630 may be turned off when the control signal LNA_ON− may be asserted. Accordingly, the currents provided by the PMOS current sources 624, 626 . . . 628 may flow through the resistor 632 and the transistor 634, thereby providing a voltage level at the node B. The voltage at the node B may depend on, for example, the current from the PMOS current sources 624, 626 . . . 628. The current through the current sources 410a and 410b may be determined by, for example, the voltage at the node B, which may be the biasing voltage at the gates of the transistors 410a and 410b. The resistors 632 and 638, and the capacitor 636 may be used, for example, for filtering purposes.

The amount of current that may flow through the resistor 632 may be controlled by, for example turning on or off the PMOS current sources 626 . . . 628. The PMOS current source 624 may be on whenever the control signal LNA_ON may be asserted. Accordingly, the minimum current provided by the PMOS current sources may be the current from the PMOS current source 624, and the maximum current provided may be total current from the PMOS current sources 624, 626 . . . 628. The amount of current from each PMOS current source 624, 626 . . . 628 may be controlled by, for example, the biasing voltage VBIAS. The biasing voltage VBIAS may be controlled by, for example, the baseband processor 154, the processor 156, and/or the logic block 160.

The PMOS current source 626 may be controlled by, for example, the control signal XI1_ON, which may be an output of the NAND gate 620. Similarly, the PMOS current source 629 may be controlled by, for example, the control signal XI2_ON, which may be an output of the NAND gate 622. The control signals XI1_ON and XI2_ON may be the same state as control signals I1_ON and XI2_ON when the LNA_ON signal is asserted. The control signals I1_ON and I2_ON may be generated by, for example, the baseband processor 154, the processor 156, and/or the logic block 160.

When the control signals LNA_ON and LNA_ON− are deasserted, for example, when the transceiver 200 is in a transmit mode, the PMOS current sources 624, 626 . . . 628 may be turned off, and the transistor 630 may be turned on. Accordingly, the voltage at node B may be substantially at ground, and therefore, the transistors 410a and 410b may be turned off.

Accordingly, it can be seen that most, or substantially all, of the transistors used for the LNA 400 may be turned off when the transceiver 200 may be in a transmit mode. Turning off of substantially all transistors may be accomplished by using the signals LNA_ON and/or LNA_ON− to control the gate voltages at a plurality of transistors. This may allow the input transistors 302 and 304, which may not be turned off, to float with the input signals IN+ and IN−, respectively, and thereby avoid gate-drain and/or gate-source damage due to high input signals.

Figure 7:
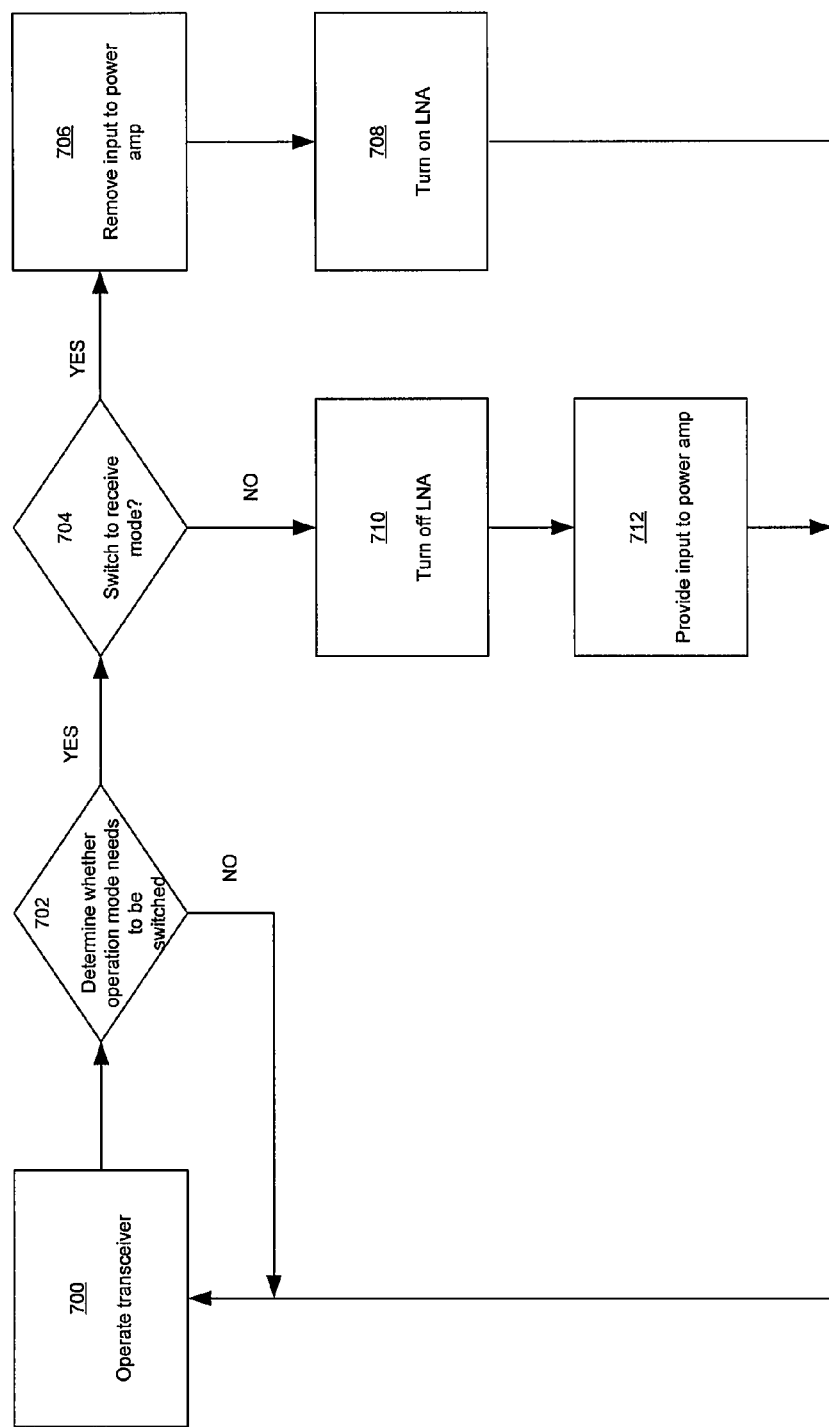
FIG. 7 is a flow diagram illustrating use of a LNA that tolerates large input signals, in accordance with an embodiment of the invention.

FIG. 7 is a flow diagram illustrating use of a LNA that tolerates large input signals, in accordance with an embodiment of the invention. Referring to FIG. 7, there is shown steps 700 to 712. In step 700, the transceiver 200 may be operating in a present mode. For example, if the present operating mode is a receive mode, the LNA 400 may be turned on and there may not be an input signal to the power amplifier 204. Otherwise, if the present operating mode is a transmit mode, the LNA 400 may be turned off and the power amplifier 204 may amplify an input signal for transmission.

In step 702, a determination may be made as to whether the operating mode may need to be switched. For example, if the present operating mode is a transmit mode, the transceiver 200 may need to switch to receive mode to be able to receive signals from other wireless terminals, including a cell site. Similarly, if the present operating mode is a receive mode, the transceiver 200 may need to switch to transmit mode to transmit RF signals. If the operating mode needs to be switched, the next step may be step 704. Otherwise, the next step may be step 700.

In step 704, if the next operating mode is a receive mode, the next step may be step 706. Otherwise, the next step may be step 710. In step 706, the wireless transceiver 200 may be configured to operate in a receive mode. For example, input to the power amplifier 204 may be removed. This may comprise waiting a sufficiently long time to allow the present signals that may need to be transmitted to be amplified and then transmitted. After the signals that need to be transmitted have been processed by the power amplifier 204, no more signals may be presented to the power amplifier 204 for amplification. In step 708, the LNA 400 may be turned on to amplify received signals. The next step may be step 700.

In step 710, the LNA 400 may be turned off. Similarly to the step 706, the LNA 400 may be turned off after waiting a sufficient amount of time to finish processing received signals. For example, this may comprise receiving and processing of a remainder of a packet before turning off the LNA 400. After the processing by the LNA 400 is finished, the LNA 400 may be turned off. In step 712, the power amplifier 204 may be provided with input signals that may be amplified. The next step may be step 700.

While the LNA 400 was in an off state, the transistors in the LNA 400 may have been turned off. Accordingly, this may allow the input transistors 302 and 304 to float with the high power signals from the power amplifier 204. The transistors 302 and 304 may therefore not suffer damage due to gate-source and/or gate-drain breakdown.

Although some embodiments of the invention may have been described, the invention need not be so limited. For example, different biasing circuitry than the exemplary circuit shown with respect to FIG. 6A may be used. Similarly, different current source circuitry than the exemplary current source circuitry shown with respect to FIG. 6B may be used. For example, the current sources 410a and 410b may be controlled by separate biasing voltages in order to compensate for the transistor 412, if the transistor 412 provides undesired resistance when it is turned on.

In accordance with an embodiment of the invention, aspects of an exemplary system may comprise individual current sources 410a and 410b for the input transistors 302 and 304, respectively, of the LNA 400. The individual current sources 410a and 410b may be isolated from each other when the LNA 400 is turned off. When the LNA 400 is turned on, the individual current sources 410a and 410b may be formed into a common current source for the input transistors 302 and 304. When the LNA is turned off, the control signals LNA_ON and/or LNA_ON− generated by, for example, the baseband processor 154, the processor 156, and/or the logic block 160, may be used to turn off most, or substantially all, of the transistors in the LNA. Accordingly, the drain and source terminals of the input transistors 302 and 304 may float since they may not be directly coupled to other transistors that may provide a voltage.

The individual current sources may be isolated by a switch, such as, for example, the transistor 412 that may be used to couple the source terminals of the input transistors 302 and 304. The source terminal of the input transistor 302 may be directly electrically coupled a drain terminal or a source terminal of the coupling transistor 412. The source terminal of input transistor 304 may then be directly electrically coupled to the other of the drain terminal or source terminal of the coupling transistor 412. Accordingly, the individual current sources 410a and 410b may be formed into a common current source when the LNA is turned on by turning on the coupling transistor 412 to short the source terminals of the input transistors 302 and 304.

In this manner, the input transistors 302 and 304 may individually float with the input signal at the respective gates. By floating, the input transistors 302 and 304 may not be subject to breakdown due to gate-source voltage or gate-drain voltage that may be equal to or exceed a breakdown voltage for the input transistors 302 and/or 304.

Another embodiment of the invention may provide a machine-readable storage, having stored thereon, a computer program having at least one code section executable by a machine, thereby causing the machine to perform the steps as described above for a low noise amplifier with tolerance to large inputs.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will comprise all embodiments falling within the scope of the appended claims.

What is claimed is:

1. A method for processing signals, the method comprising:
   in a circuit comprising a low noise amplifier (LNA) coupled to a power amplifier (PA), wherein input transistors of said LNA are coupled to outputs of said PA;
   configuring input transistors of said LNA to float with a signal generated by said PA, wherein said input transistors are isolated from each other, and output transistors of said LNA are turned off when said LNA is turned off; and
   supplying current from a common current source for each of said input transistors to said LNA when said LNA is turned on, wherein said common current source comprises individual current sources coupled to each of said input transistors.

2. The method according to claim 1, comprising turning off substantially all transistors in said LNA when said LNA is turned off, wherein said input transistors are not turned off.

3. The method according to claim 1, comprising isolating said input transistors with a switch.

4. The method according to claim 3, comprising turning off a coupling transistor that couples source terminals of each of said input transistors for accomplishing said isolating.

5. The method according to claim 4, comprising directly electrically coupling a source terminal of a first of said input transistors to a drain terminal or a source terminal of said coupling transistor.

6. The method according to claim 5, comprising directly electrically coupling a source terminal of a second of said input transistors to a remaining uncoupled one of: said drain terminal and said source terminal of said coupling transistor.

7. The method according to claim 1, comprising shorting said individual current sources to each other when said LNA is said turned on to form said common current source.

8. The method according to claim 7, comprising turning on a coupling transistor that couples source terminals of said input transistors to accomplish said shorting.

9. The method according to claim 8, comprising directly electrically coupling a source terminal of a first of said input transistors to one of: a drain terminal and source terminal of said coupling transistor.

10. The method according to claim 9, comprising directly electrically coupling a source terminal of a second of said input transistors to a remaining uncoupled one of: said drain terminal and said source terminal of said coupling transistor.

11. A system for processing signals, the system comprising:
    one or more circuits comprising a low noise amplifier (LNA) and a power amplifier (PA), wherein said LNA is coupled to said PA, and input transistors of said LNA are coupled to outputs of said PA, wherein said one or more circuits are operable to:
    configure input transistors of said LNA to float with a signal generated by said PA, wherein said input transistors are isolated from each other, and output transistors of said LNA are turned off when said LNA is turned off; and
    supply current from a common source for each of said input transistors to said LNA when said LNA is turned on, wherein said common current source comprises individual current sources coupled to each of said input transistors.

12. The system according to claim 11, wherein said one or more circuits enables turning off substantially all transistors in said LNA when said LNA is turned off, wherein said input transistors may not be turned off.

13. The system according to claim 11, wherein said one or more circuits comprise a switch, and said one or more circuits is operable to isolate said input transistors.

14. The system according to claim 13, wherein said switch comprises a coupling transistor that couples source terminals of each of said input transistors wherein said one or more circuits comprise a switch, and said one or more circuits is operable to isolate said input transistors.

15. The system according to claim 14, wherein a source terminal of a first of said input transistors is directly electrically coupled to a drain terminal or a source terminal of said coupling transistor.

16. The system according to claim 15, wherein a source terminal of a second of said input transistors is directly electrically coupled to a remaining uncoupled one of: a drain terminal and source terminal of said coupling transistor.

17. The system according to claim 11, wherein said common current source is formed by shorting said individual current sources to each other.

18. The system according to claim 17, wherein said one or more circuits comprise a coupling transistor, and said coupling transistor is turned on to couple source terminals of said input transistors to accomplish said shorting.

19. The system according to claim 18, wherein said source terminal of a first of said each input transistor is directly electrically coupled to one of: a drain terminal and source terminal of said coupling transistor.

20. The system according to claim 19, wherein a source terminal of a second of said input transistors is directly electrically coupled to another of: said drain terminal and said source terminal of said coupling transistor.

* * * * *